(12) United States Patent
Iorga

(10) Patent No.: US 6,831,473 B2
(45) Date of Patent: Dec. 14, 2004

(54) RING CALIBRATION APPARATUS AND METHOD FOR AUTOMATIC TEST EQUIPMENT

(75) Inventor: Cosmin Iorga, Oak Park, CA (US)

(73) Assignee: Teradyne, Inc., Boston, MA (US)

( * ) Notice: Subject to any disclaimer, the term of this patent is extended or adjusted under 35 U.S.C. 154(b) by 132 days.

(21) Appl. No.: 10/183,576

(22) Filed: Jun. 25, 2002

(65) Prior Publication Data

US 2003/0234645 A1 Dec. 25, 2003

(51) Int. Cl.⁷ .............................................. G01R 31/26
(52) U.S. Cl. ...................................................... 324/765
(58) Field of Search .............................. 324/158.1, 763, 324/764, 765, 601, 130; 375/254, 257, 377; 326/23, 24, 26

(56) References Cited

U.S. PATENT DOCUMENTS 5,764,394 A * 6/1998 Yamazaki et al. .......... 398/136
6,160,851 A * 12/2000 Brown et al. ............... 375/254

* cited by examiner

Primary Examiner—David A. Zarneke
Assistant Examiner—Trung Q. Nguyen
(74) Attorney, Agent, or Firm—Teradyne Legal Dept.

(57) ABSTRACT

A calibration circuit for use in automatic test equipment is disclosed. The calibration circuit includes a calibration signal driver having an output and a closed-loop transmission line coupled to the output of the calibration signal driver. A plurality of comparators having respective reference inputs, test signal inputs, and calibration inputs are coupled to the closed-loop transmission line. The plurality of comparators are adapted to selectively receive calibration signals generated by the driver in parallel along the closed-loop transmission line.

7 Claims, 4 Drawing Sheets

RING CALIBRATION APPARATUS AND METHOD FOR AUTOMATIC TEST EQUIPMENT

FIELD OF THE INVENTION

The invention relates generally to automatic test equipment and more particularly a calibration circuit arrangement and method for use in a semiconductor tester to minimize calibration processing time in a production testing environment.

BACKGROUND OF THE INVENTION

Semiconductor device manufacturing typically includes test processes at both the wafer and packaged-device levels. The testing is normally carried out by automatic test equipment (ATE) that simulates a variety of operating conditions to verify the functionality of each device.

Referring to FIG. 1, a typical semiconductor tester 10 generally includes a computer workstation 12 coupled to a databus 14 that routes signals to and from pattern generation circuitry 16, timing circuitry 18 and failure processing circuitry 20. The timing circuitry responds to programmed patterns from the pattern generator to provide precisely timed tester events. The events, in turn, activate driver/comparator circuitry 22 that interfaces to one or more devices-under-test (DUTs) 24.

As the speeds of modern semiconductors increase, the edge-placement accuracy requirements for testing the DUTs become more stringent. Edge-placement accuracy generally refers to the acceptable offset of a rising or falling signal "edge" with respect to another edge or reference point. Consequently, ATE manufacturers must balance cost, parallelism and accuracy, among other things, when designing ATE for widespread acceptance by semiconductor manufacturers.

Like any sophisticated measuring instrument, a semiconductor tester often requires calibration of its channels in order to maintain expected edge-placement accuracy levels. With further reference to FIG. 1, calibration circuitry 26 modifies the timing circuitry output signals, as needed during a test, to compensate for signal degradation and skews between the individual channels 28. Calibration often involves detecting channel-to-channel timing skews, and providing compensating delays to the tester signals during the test to account for the skew. This is important in order to ensure that all the signal edges applied to or captured from the DUTs on a given cycle are done so at the DUT pins synchronously.

With reference to FIG. 2, the channel architecture for a semiconductor tester typically includes a driver 28, a comparator 30, a transmission line 32 and a plurality of relays R1–R4 that selectively vary the channel signal path between the driver/comparator. The transmission line is typically open-ended during calibration procedures. Conventional calibration schemes for high performance testers often employ time-domain-reflectometry procedures, wherein each channel CH0-CHN (in phantom) of the tester is sequentially fed a calibration signal from a master driver/comparator 36. A switch matrix 38 directs the calibration signal to/from the master driver/comparator to the channels. The channel relays are then selectively activated to route the calibration signal and its reflection appropriately. By measuring the delay between the application of the pulse and its reflection, calibration offsets may be calculated, stored in a calibration memory associated with the calibration circuitry 26 (FIG. 1), and applied to the tester signals during a test to minimize channel-to-channel skew.

While this method works well for its intended applications, the sequential measurement scheme takes a substantial amount of time. The longer a tester remains out of a production line (to undergo calibration) the costlier the test process overall. Thus, to desirably reduce test costs, it would be beneficial to reduce calibration times while still retaining the required level of accuracy. The apparatus and method of the present invention addresses these needs.

SUMMARY OF THE INVENTION

The ring calibration apparatus and method of the present invention provides for high-speed calibration of multiple tester channels in parallel. As a result, semiconductor device manufacturers can minimize tester downtime in order to maximize device throughput, and correspondingly reduce test costs.

To realize the foregoing advantages, the invention in one form comprises a calibration circuit for use in automatic test equipment. The calibration circuit includes a calibration signal driver having an output and a closed-loop transmission line coupled to the output of the calibration signal driver. A plurality of comparators having respective reference inputs, test signal inputs, and calibration inputs are coupled to the closed-loop transmission line. The plurality of comparators are adapted to selectively receive calibration signals generated by the driver in parallel along the closed-loop transmission line.

In another form, the invention comprises a calibration system for use with automatic test equipment. The calibration system includes a region card including a master driver having an output, and a master ring transmission line coupled to the driver output. The system further includes a plurality of channel cards, each channel card including a calibration circuit. The calibration circuit includes a calibration signal driver having an output and a closed-loop transmission line coupled to the output of the calibration signal driver. A plurality of comparators are included, each comparator having a reference input, a test signal input, and a calibration input. The calibration input is coupled to the closed-loop transmission line. The plurality of comparators are adapted to selectively receive calibration signals generated by the driver in parallel along the closed-loop transmission line, and wherein the calibration signal drivers are coupled to the master ring transmission line.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The ring calibration apparatus and method of the present invention minimizes calibration costs attributable to the cost of ATE by enabling the calibration of multiple channels in parallel. This is accomplished by employing a ring transmission line 44 that provides a common calibration reference to the desired channels of interest.

Figure 1:
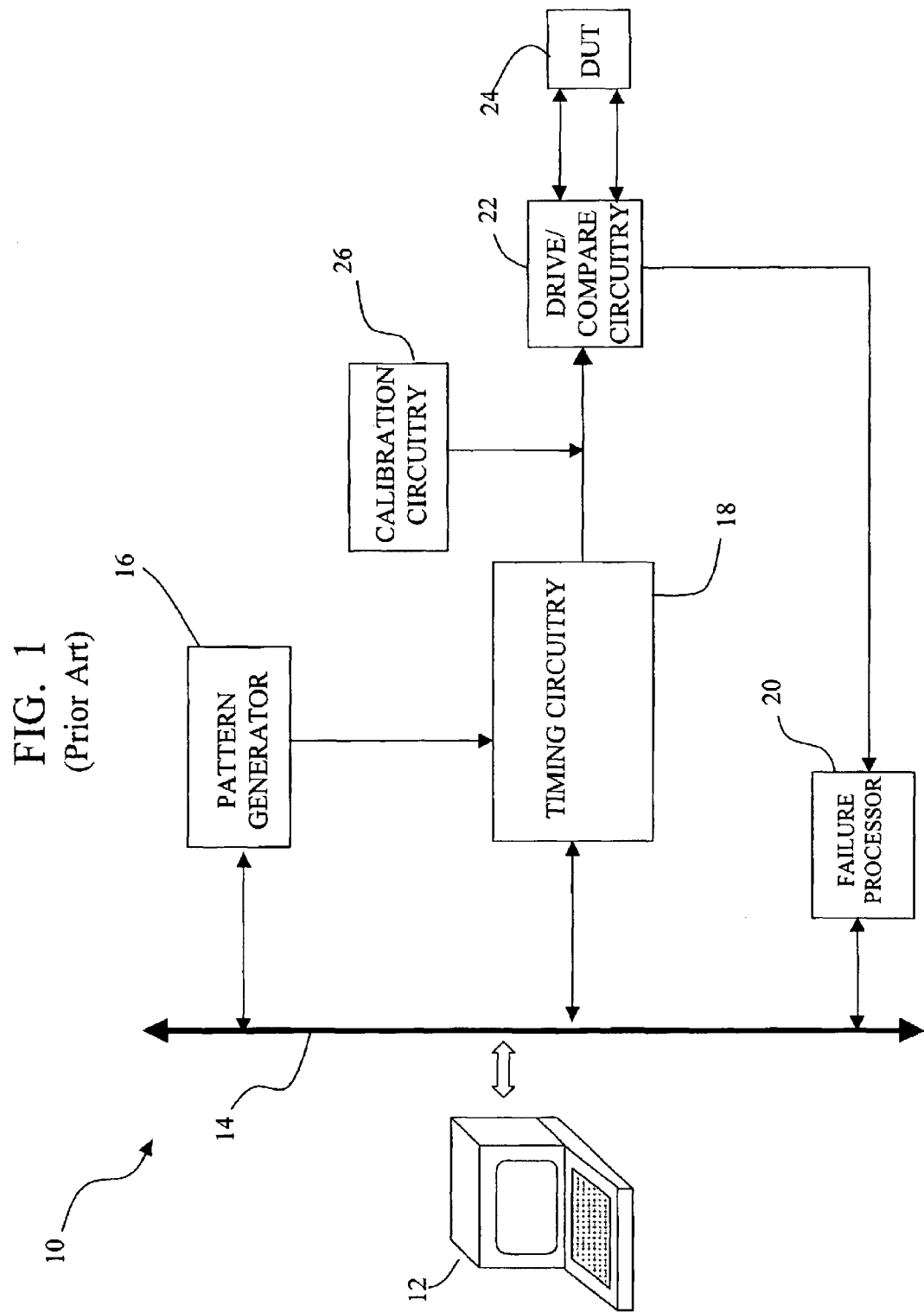
FIG. 1 is a block diagram of a conventional semiconductor tester.
Figure 2:
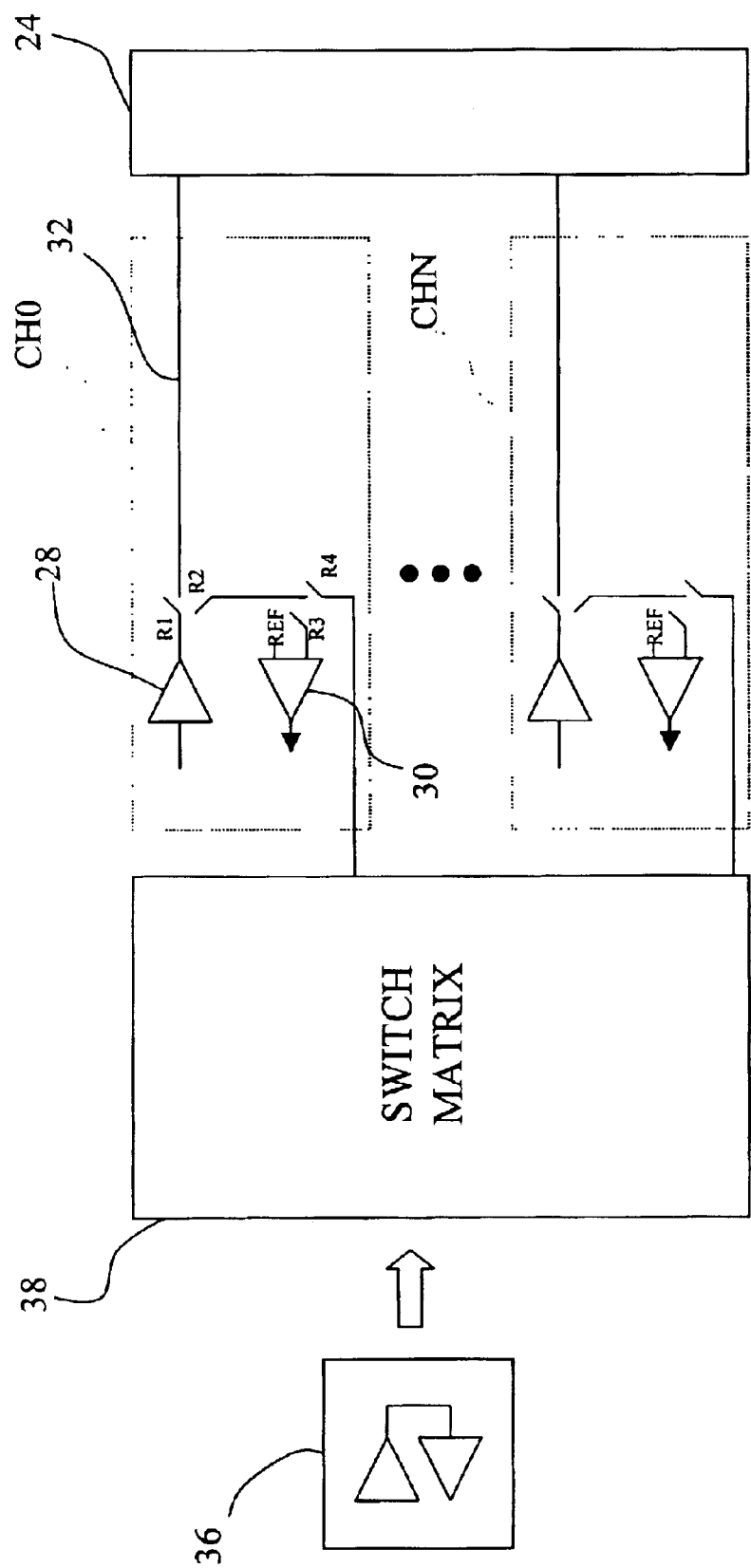
FIG. 2 is a block diagram of the conventional calibration and channel circuitry.
Figure 3:
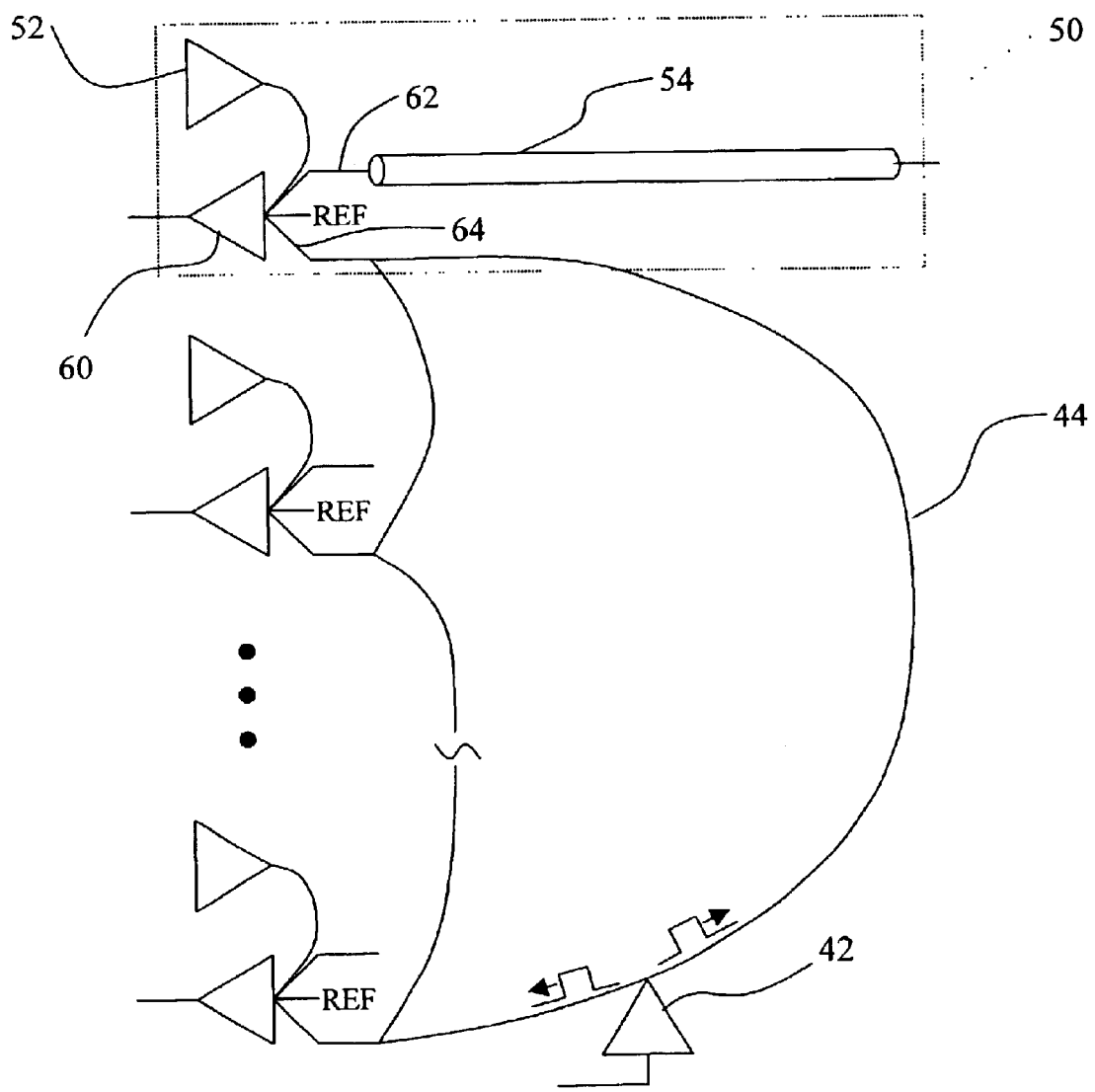
FIG. 3 is a block diagram of the ring calibration and channel circuitry according to one form of the present invention.

Referring now to FIG. 3, a calibration circuit 40 is shown for use with a plurality of semiconductor tester channels 50. Each channel includes a driver 52, a comparator 60 and a transmission line 54. The circuit has particular application for calibrating channel-to-channel skew between the comparators for the separate channels. Calibration circuitry for calibrating the drivers 52 may be implemented as described in U.S. Pat. No. 6,609,077, titled ATE Timing Measurement Unit, filed May 31, 2000, assigned to the assignee of the present invention, and expressly incorporated herein by reference.

With continued reference to FIG. 3, the calibration circuit 40 includes a master driver 42 with an output coupled to a ring, or closed-loop, transmission line 44. The transmission line is coupled to each comparator signal input in a "daisychain"—like fashion to form the desired "ring."

Figure 4:
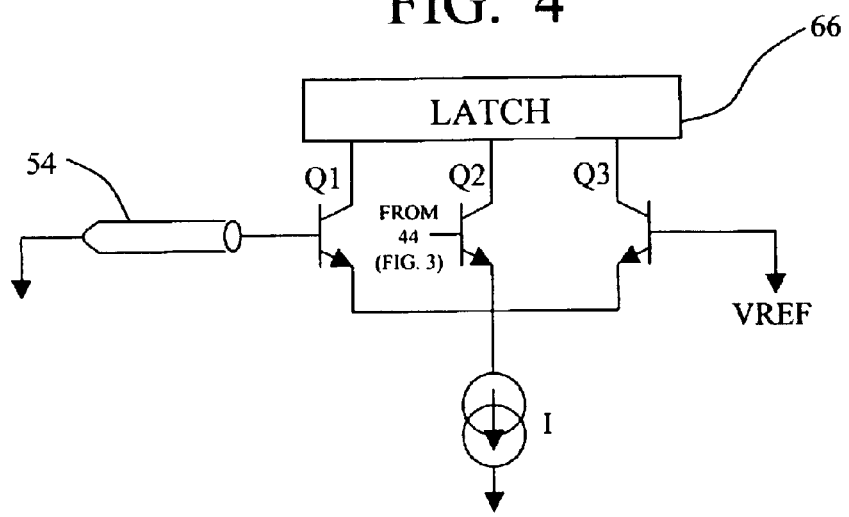
FIG. 4 is a block diagram of a three-input comparator employed in the ring calibration circuitry of FIG. 3.

In a preferred embodiment, each comparator 60 comprises a unique three-input configuration to eliminate the use of relays in the calibration circuit 40. Referring to FIGS. 3 and 4, each comparator includes a reference signal input REF coupled to a threshold voltage source (not shown) and a test signal input 62 coupled to the channel transmission line 54. A separate calibration input 64 is also provided, which is coupled to the ring transmission line 44.

As shown more clearly in FIG. 4, the three-input comparator is realized by a tri-configuration of transistors Q1–Q3, and a current source I. The first transistor Q1 includes a base terminal tied to the channel transmission line 54, while reference transistor Q3 has a base, coupled to the reference voltage VREF. Both transistors Q1 and Q3 have their emitters tied to the current source I. These two transistors form a differential pair as is well-known in the art.

The calibration transistor Q2 is disposed in parallel with the test signal transistor Q1, and has its base terminal tied to the ring transmission line 44. The collectors of all of the transistors are coupled to data latch circuitry 66 that is well known to those skilled in the art. Generally, transistors Q1 and Q2 stay off unless activated by a pulse sensed on the base terminal. In compare mode Q2 will be kept OFF by setting the base to ground or the lowest supply voltage. In the calibration mode Q1 will be turned OFF, also by setting the base to ground or the lowest supply voltage. As a result, separate relays to selectively activate the inputs are unnecessary. This dramatically improves the reliability of the channel architecture.

In operation, the master driver 42 is programmed to deliver a pulse to the ring transmission line 44 at a pre-set time. The master driver has a matched output impedance with the line and thus no reflections occur when the pulse returns to the driver. The master driver can be implemented as two separate drivers, one sending the pulse towards the left side of the ring, and the second to the right site. This implementation makes easier the impedance matching between the drivers and transmission path. Because of the closed transmission path, the pulse propagates in both directions on the transmission line ring. Each comparator 60 will see two pulses shifted in time corresponding to the delays of the propagation paths on the ring. The comparator of channel X will find the first pulse at the moment Tx1:

$$Tx1 = T1 + Toff$$

and the second pulse at $$Tx2 = T2 + Toff$$

referenced to the time t0=0 when the master driver sent the pulse. The purpose of the comparator calibration is to find the offset time, Toff, of each comparator. From the two equations above, the difference between T2 and T1 is $$T2 - T1 = Tx2 - Tx1.$$

Considering that the total path delay T equals $$T = T2 + T1$$

for any channel, equations (3) and (4) form a system of two equations with two unknowns, T1 and T2. Thus, T1 and T2 can be calculated as $$T1 = (T - (Tx2 - Tx1))/2$$

$$T2 = (T + (Tx2 - Tx1))/2$$

The timing offset of the comparator is calculated as $$Toff = Tx1 - T1 = Tx1 - (T - (Tx2 - Tx1))/2$$

or $$Toff = Tx2 - T2 = Tx2 - (T + (Tx2 - Tx1))/2$$

The offset value depends on the difference of two edge measurements and the total delay of the ring 44. Since the total delay of the ring is a constant for all channels, any error in measuring it will add to all channels and will not affect the deskew accuracy. Assuming that the comparator 60 can do accurate differential measurements, the only source of errors is related to the waveform fidelity on the ring transmission path.

In practice, data is collected in parallel for all of the channels and processed in order to determine proper calibration offsets. During production testing of semiconductor devices, the calibration offsets will help minimize channel-to-channel skew.

Figure 5:
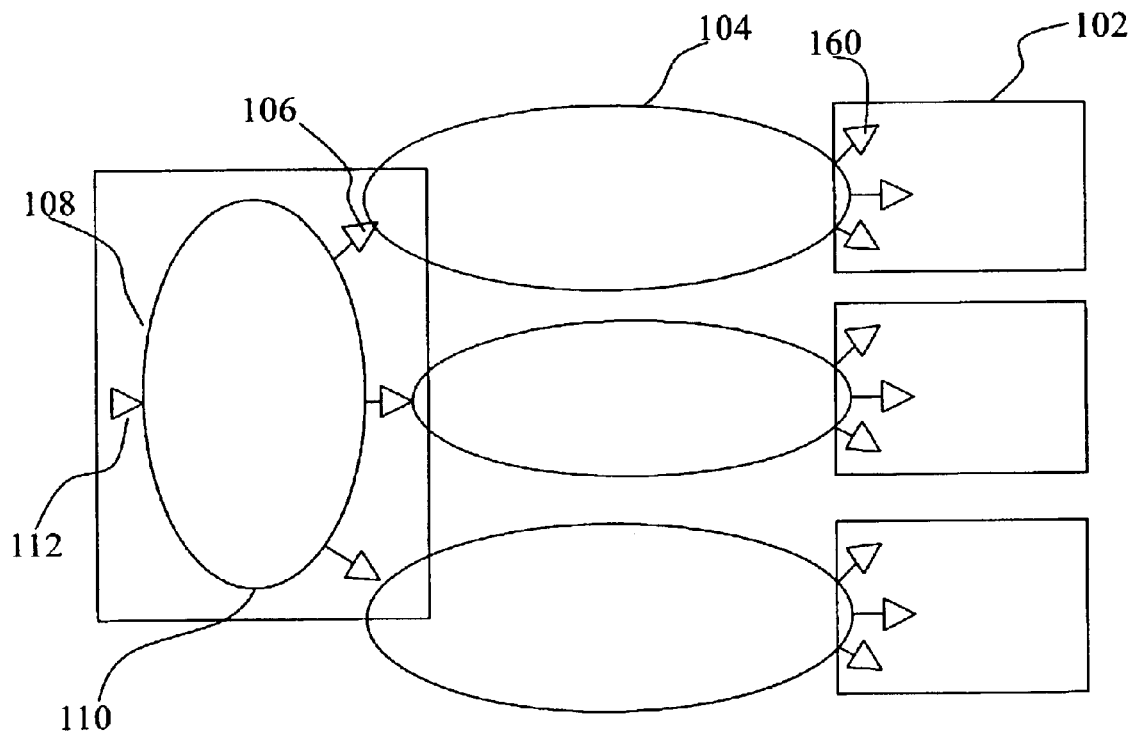
FIG. 5 is a block diagram of a ring calibration circuit according to a second embodiment of the present invention.

FIG. 5 illustrates a ring calibration circuit according to a second embodiment of the present invention, generally designated 100. Because semiconductor testers often include hundreds, even thousands of channels, the channels are grouped on circuit board assemblies often called "channel cards 102." Each card may have the resources for sixteen, thirty-two, sixty-four or more channels. Consequently, the embodiment of FIG. 5 employs multiple transmission line rings 104 corresponding to the multiple channel cards.

Further referring to FIG. 5, each channel card ring transmission line 104 is driven by a calibration driver 106. The calibration drivers for all of the channel cards reside on a region card 108, and are calibrated by a master transmission line ring 110 driven by a master driver 112. This construction avoids making too many connections on any single ring transmission line, which might create unwanted capacitance, etc. on the line. The channel card comparators 160 are of the same construction as those described for the previous embodiment.

Those skilled in the art will appreciate the many benefits and advantages afforded by the present invention. In particular, calibration hardware costs are reduced by sharing deskew circuits among multiple channels without affecting moderate accuracy requirements. Moreover, multiple testing modes for varying accuracy requirements are achievable with no hardware modifications, but rather by merely employing unique calibration and testing steps with the calibration hardware noted above.

While the invention has been particularly shown and described with reference to the preferred embodiments thereof, it will be understood by those skilled in the art that various changes in form and detail may be made therein without departing from the spirit and scope of the invention. For example, while the three-input comnparator construction was described as incorporating bipolar transistor technology, any transistor technology is within the scope of the present invention.

What is claimed is:

1. A calibration circuit for use in automatic test equipment, the calibration circuit including:
    a calibration signal driver having an output;
    a closed-loop transmission line coupled to the output of the calibration signal driver; and
    a plurality of comparators, each comparator having a reference input, a test signal input, and a calibration input, the calibration input coupled to the closed-loop transmission line, the plurality of comparators adapted to selectively receive calibration signals generated by the driver in parallel along the closed-loop transmission line.

2. A calibration circuit according to claim 1 wherein each of the plurality of comparators comprises:
    a current source;
    a test signal transistor coupled to the current source and including the test signal input;
    a reference transistor coupled to the current source and having the reference input, the test signal transistor and the reference transistor cooperating to define a differential pair;
    a calibration transistor including the calibration input and operative to, with the test signal transistor off, cooperate with the reference transistor to define a second differential pair; and
    latch circuitry coupled to the outputs of the test signal, reference, and calibration transistors.

3. A calibration circuit for use in automatic test equipment, the calibration circuit including:
    a closed-loop transmission line;
    means for delivering a calibration pulse along the closed-loop transmission line, the calibration pulse having first and second pulse components propagating in opposite directions on the closed-loop transmission line;
    means for detecting the timing delays of the first and second pulse components; and
    means for determining a calibration offset value based on the detected timing delays.

4. A calibration circuit according to claim 3 wherein the means for delivering a calibration pulse comprises:
    a calibration signal driver having an output coupled to the closed-loop transmission line.

5. A calibration according to claim 3 wherein the means for detecting comprises:
    a plurality comparators, each comparator having a reference input, a test signal input, and a calibration input, the calibration input coupled to the closed-loop transmission line, the plurality of comparators adapted to selectively receive calibration signals generated by the means for delivering in parallel along the closed-loop transmission line.

6. A calibration circuit according to claim 5 wherein each of the plurality of comparators comprises:
    a current source;
    a test signal transistor coupled to the current source and including the test signal input;
    a reference transistor coupled to the current source and having the reference input, the test signal transistor and the reference transistor cooperating to define a differential pair;
    a calibration transistor including the calibration input and operative to, with the test signal transistor off, cooperate with the reference transistor to define a second differential pair; and
    latch circuitry coupled to the outputs of the test signal, reference and calibration transistors.

7. A method of calibrating automatic test equipment, the method comprising the steps:
    establishing a closed-loop transmission line with a plurality of comparators, each comparator having a reference input, a test signal input, and a calibration input, the calibration input coupled to the closed-loop transmission line;
    delivering a calibration pulse along the closed-loop transmission line, the calibration pulse having first and second components propagating in opposite directions on the closed-loop transmission line;
    detecting the timing delay of the first pulse component with each of the comparators;
    detecting the timing delay of the second pulse component with each of the comparators; and
    determining a calibration offset value based on the detected timing delays of the first and second pulse components.

* * * * *